United States Patent
Lee

(10) Patent No.: US 10,523,216 B2
(45) Date of Patent: Dec. 31, 2019

(54) RECEIVING CIRCUIT, SEMICONDUCTOR APPARATUS INCLUDING THE RECEIVING CIRCUIT AND SEMICONDUCTOR SYSTEM USING THE RECEIVING CIRCUIT

(71) Applicant: SK hynix Inc., Icheon-si, Gyeonggi-do (KR)

(72) Inventor: Hyun Bae Lee, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 16/201,315

(22) Filed: Nov. 27, 2018

(65) Prior Publication Data
US 2019/0319629 A1    Oct. 17, 2019

(30) Foreign Application Priority Data
Apr. 17, 2018 (KR) .................. 10-2018-0044303

(51) Int. Cl.
G06F 13/00 (2006.01)
H04B 1/06 (2006.01)
H04B 3/00 (2006.01)
H03L 7/081 (2006.01)
G11C 7/22 (2006.01)

(52) U.S. Cl.
CPC .......... *H03L 7/0812* (2013.01); *G11C 7/222* (2013.01)

(58) Field of Classification Search
CPC combination set(s) only.
See application file for complete search history.

(56) References Cited

U.S. PATENT DOCUMENTS

| | | | | |
|---|---|---|---|---|
| 4,990,911 A | * | 2/1991 | Fujita | H04N 7/0102 327/113 |
| 6,424,684 B1 | * | 7/2002 | Baker | H04L 25/068 327/64 |
| 7,418,038 B2 | * | 8/2008 | Kikuchi | H04B 3/30 375/257 |
| 9,214,200 B2 | | 12/2015 | Bucher et al. | |

* cited by examiner

*Primary Examiner* — An T Luu
(74) *Attorney, Agent, or Firm* — William Park & Associates Ltd.

(57) ABSTRACT

A semiconductor apparatus includes an internal clock generation circuit, a receiver, and a sampling circuit. The internal clock generation circuit generates a receiving clock signal and a sampling clock signal based on a reference clock signal, the sampling clock signal having a phase different from the receiving clock signal. The receiver receives an input signal in synchronization with the receiving clock signal and to generate an amplified signal. The sampling circuit samples the amplified signal in synchronization with the sampling clock signal to generate an output signal.

21 Claims, 9 Drawing Sheets

RECEIVING CIRCUIT, SEMICONDUCTOR APPARATUS INCLUDING THE RECEIVING CIRCUIT AND SEMICONDUCTOR SYSTEM USING THE RECEIVING CIRCUIT

CROSS-REFERENCES TO RELATED APPLICATION

The present application claims priority under 35 U.S.C. § 119(a) to Korean application number 10-2018-0044303, filed on Apr. 17, 2018, in the Korean Intellectual Property Office, which is incorporated herein by reference in its entirety.

BACKGROUND

1. Technical Field

Various embodiments generally relate to receiving circuit and semiconductor apparatus including the receiving circuit and, more particularly, to a receiving circuit and/or semiconductor apparatus including a receiving circuit, and a semiconductor system.

2. Related Art

Each of electronic apparatuses may include a large number of electronic components. Among the electronic apparatuses, a computer system may include a large number of semiconductor apparatuses which are constructed by semiconductors. The semiconductor apparatuses which construct the computer system may communicate with one another by transmitting or receiving a clock and data. As the operating speed of the computer system increases, the operating speed of the semiconductor apparatuses is increasing as well. For example, the frequency of a clock signal is increasing so that data communication may be performed at a high speed between semiconductor apparatuses.

Semiconductor apparatuses may transmit data to an external apparatus in synchronization with a clock signal, or may receive data transmitted from an external apparatus, in synchronization with a clock signal. As the frequency of a clock signal increases, a time margin for transmitting and receiving data is gradually decreasing. Also, in proportion to a decreasing margin, the eye or valid window of transmitted and received data is also decreasing. The semiconductor apparatuses may be coupled with the external apparatus through a signal transmission line. The signal transmission line may include a clock bus for transmitting a clock signal and a data bus for transmitting data. In the case where certain signals are transmitted through a plurality of signal transmission lines, a crosstalk may occur between adjacent signal transmission lines. Also, a crosstalk may occur due to a reflection occurred in a signal transmission line. The crosstalk may serve as a factor that further decreases the eye or valid window of data.

SUMMARY

In an embodiment, a semiconductor apparatus includes an internal clock generation circuit, a receiver, and a sampling circuit. The internal clock generation circuit is configured to generate a receiving clock signal and a sampling clock signal based on a reference clock signal, the sampling clock signal having a phase different from the receiving clock signal. The receiver is configured to receive an input signal in synchronization with the receiving clock signal and to generate an amplified signal. The sampling circuit is configured to sample the amplified signal in synchronization with the sampling clock signal and to generate an output signal.

In an embodiment, a semiconductor apparatus includes an internal clock generation circuit, receiver, and a sampling circuit. The internal clock generation circuit is configured to generate a receiving clock signal which has a first pulse width and a sampling clock signal which has a second pulse width different from the first pulse width, the sampling clock signal having a phase later than the receiving clock signal, based on a reference clock signal. The receiver is configured to receive an input signal in synchronization with the receiving clock signal and to generate an amplified signal. The sampling circuit is configured to sample the amplified signal in synchronization with the sampling clock signal and to generate an output signal.

In an embodiment, a receiving circuit includes a receiver, a signal line, and a sampling circuit. The receiver is configured to receive input data in synchronization with a receiving clock signal and generate an amplified data. The signal line is configured to maintain a level of the amplified data for a predetermined time, based on the receiving clock signal. The sampling circuit is configured to amplify a voltage level of the data line in synchronization with a sampling clock signal and generate output data.

DETAILED DESCRIPTION

Hereinafter, a receiving circuit, a semiconductor apparatus and a semiconductor system using the same will be described below with reference to the accompanying drawings through various examples of embodiments.

Various embodiments are directed to a receiving circuit capable of receiving data by using a plurality of clock signals having different characteristics, and a semiconductor apparatus and a semiconductor system using the same.

Figure 1:
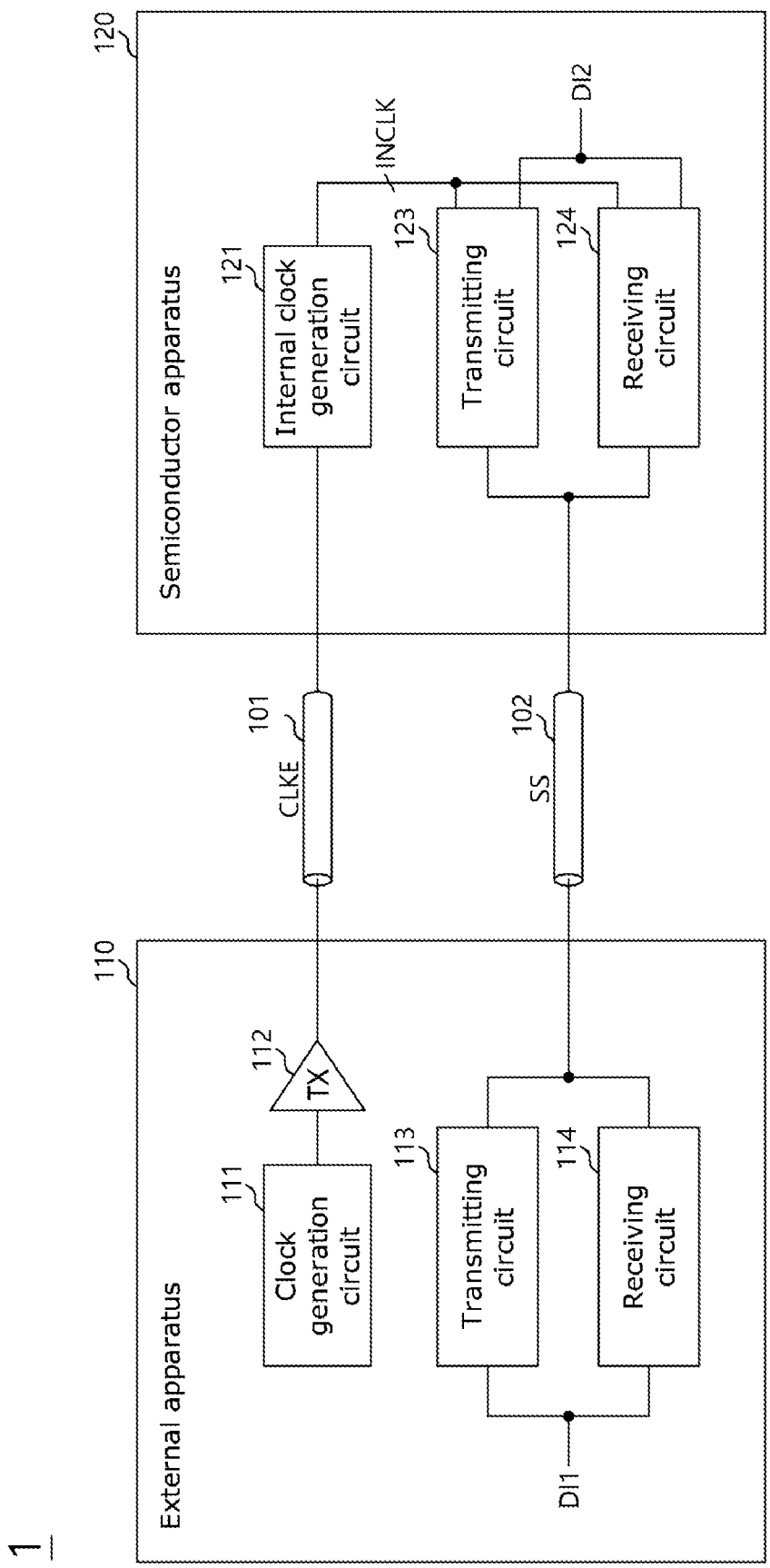
FIG. 1 is a diagram illustrating a configuration of a semiconductor system in accordance with an embodiment.

FIG. 1 is a diagram illustrating a configuration of a semiconductor system 1 in accordance with an embodiment. In FIG. 1, the semiconductor system 1 may include an external apparatus 110 and a semiconductor apparatus 120. The external apparatus 110 may provide various control signals necessary for the semiconductor apparatus 120 to operate. The external apparatus 110 may include various kinds of apparatuses. For example, the external apparatus 110 may be a host apparatus such as a central processing unit (CPU), a graphic processing unit (GPU), a multimedia processor (MMP), a digital signal processor, an application processor AP or a memory controller. Also, the external apparatus 110 may be a test apparatus or a test equipment for testing the semiconductor apparatus 120. The semiconductor apparatus 120 may be, for example, a memory apparatus, and the memory apparatus may include a volatile memory or a nonvolatile memory. The volatile memory may include an SRAM (static RAM), a DRAM (dynamic RAM), or an SDRAM (synchronous DRAM), and the nonvolatile memory may include a ROM (read only memory), a PROM (programmable ROM), an EEPROM (electrically erasable and programmable ROM), an EPROM (electrically programmable ROM), a flash memory, a PRAM (phase change RAM), an MRAM (magnetic RAM), an RRAM (resistive RAM), or an FRAM (ferroelectric RAM).

The semiconductor apparatus 120 may be coupled with the external apparatus 110 through a plurality of buses. The plurality of buses may be signal transmission paths, links or channels for transmitting signals. The plurality of buses may include a clock bus, a data bus and a command address bus. The clock bus and the command address bus may be unidirectional buses, and the data bus may be a bidirectional bus. In FIG. 1, the semiconductor apparatus 120 may be coupled with the external apparatus 110 through a clock bus 101. The external apparatus 110 may transmit an external clock signal CLKE to the semiconductor apparatus 120 through the clock bus 101, and the semiconductor apparatus 120 may receive the external clock signal CLKE through the clock bus 101. The external clock signal CLKE may include one or more pairs of clock signals. The semiconductor apparatus 120 may be coupled with the external apparatus 110 through at least one signal bus 102. The external apparatus 110 may transmit a synchronized signal SS to the semiconductor apparatus 120 or receive a synchronized signal SS transmitted from the semiconductor apparatus 120, through the signal bus 102. The semiconductor apparatus 120 may receive the synchronized signal SS transmitted from the external apparatus 110 or transmit the synchronized signal SS to the external apparatus 110, through the signal bus 102. The external apparatus 110 and the semiconductor apparatus 120 may transmit and receive the synchronized signal SS in synchronization with the external clock signal CLKE. The synchronized signal SS may be a certain kind of signal which is transmitted and received in synchronization with the external clock signal CLKE. For example, the synchronized signal SS may be data.

The external apparatus 110 may include a clock generation circuit 111, a clock transmitter 112, a transmitting circuit 113 and a receiving circuit 114. The clock generation circuit 111 may generate the external clock signal CLKE. The clock generation circuit 111 may include, for example, a clock generator such as a phase-locked loop. The clock generation circuit 111 may generate a plurality of clock signals which have a plurality of different phases, and may output some or all of the plurality of clock signals, as the external clock signal CLKE. The clock transmitter 112 may drive the clock bus 101 based on the external clock signal CLKE generated from the clock generation circuit 111. By driving the clock bus 101, the clock transmitter 112 may transmit the external clock signal CLKE to the semiconductor apparatus 120. The transmitting circuit 113 may be coupled with the signal bus 102, and drive the signal bus 102 based on an internal signal DI1 of the external apparatus 110. By driving the signal bus 102, the transmitting circuit 113 may transmit the internal signal DI1 as the synchronized signal SS to the semiconductor apparatus 120. The receiving circuit 114 may be coupled with the signal bus 102, and may receive the synchronized signal SS transmitted through the signal bus 102 and generate the internal signal DI1.

The semiconductor apparatus 120 may include an internal clock generation circuit 121, a transmitting circuit 123 and a receiving circuit 124. The internal clock generation circuit 121 may be coupled with the clock bus 101, and may receive the external clock signal CLKE transmitted through the clock bus 101. The internal clock generation circuit 121 may generate a plurality of internal clock signals INCLK by receiving the external clock signal CLKE. The internal clock generation circuit 121 may generate various internal clock signals INCLK which may be used in the semiconductor apparatus 120, and the plurality of internal clock signals INCLK may have different pulse widths and different phases. The transmitting circuit 123 may be coupled with the signal bus 102, and drive the signal bus 102 based on an internal signal DI2 of the semiconductor apparatus 120. By driving the signal bus 102, the transmitting circuit 123 may transmit the internal signal DI2 as the synchronized signal SS to the external apparatus 110. The transmitting circuit 123 may further receive the internal clock signal INCLK. The transmitting circuit 123 may transmit the synchronized signal SS to the external apparatus 110 in synchronization with the internal clock signal INCLK. The receiving circuit 124 may be coupled with the signal bus 102, and may receive the synchronized signal SS transmitted through the signal bus 102 and generate the internal signal DI2. The receiving circuit 124 may further receive the internal clock signal INCLK. The receiving circuit 124 may generate the internal signal DI2 from the synchronized signal SS based on the internal clock signal INCLK. The receiving circuit 124 may generate the internal signal DI2 from the synchronized signal SS based on at least two internal clock signals INCLK which have different pulse widths and different phases.

Figure 2:
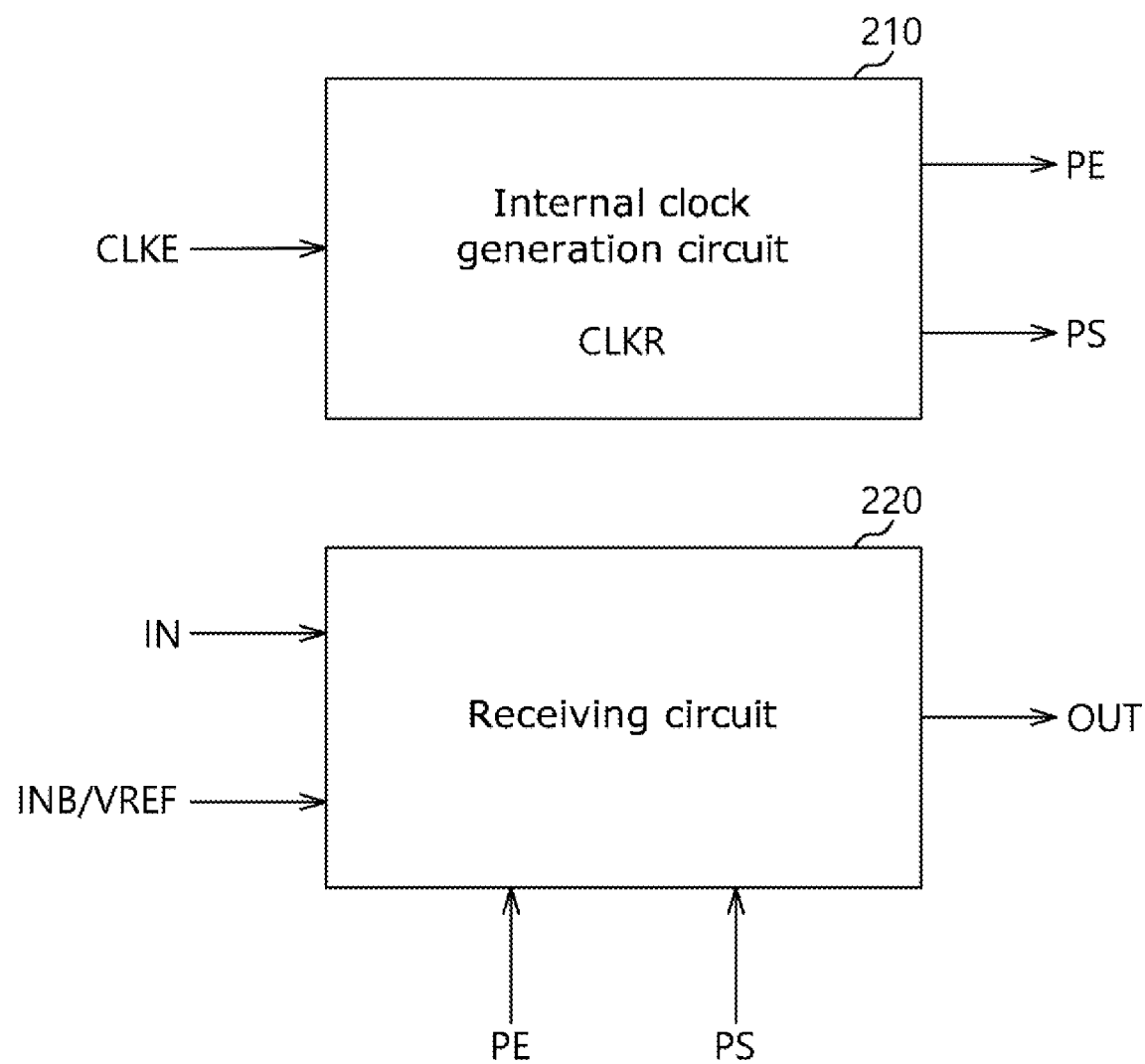
FIG. 2 is a diagram illustrating a configuration of a semiconductor apparatus in accordance with an embodiment.

FIG. 2 is a block diagram illustrating a configuration of a semiconductor apparatus 200 in accordance with an embodiment. In FIG. 2, the semiconductor apparatus 200 may include an internal clock generation circuit 210 and a receiving circuit 220. The internal clock generation circuit 210 and the receiving circuit 220 may be applied as the internal clock generation circuit 121 and the receiving circuit 124, respectively, shown in FIG. 1. The internal clock generation circuit 210 may receive an external clock signal CLKE and generate a receiving clock signal PE and a sampling clock signal PS. The internal clock generation circuit 210 may generate a reference clock signal CLKR which is synchronized with the external clock signal CLKE, and the receiving clock signal PE and the sampling clock signal PS may be generated based on the reference clock signal CLKR. The receiving clock signal PE and the sampling clock signal PS may have different pulse widths and different phases. For example, the sampling clock signal PS may have a pulse width wider than the receiving clock signal PE, and the phase of the sampling clock signal PS may be later than the phase of the receiving clock signal PE.

The receiving circuit 220 may receive an input signal IN, the receiving clock signal PE and the sampling clock signal PS and generate an output signal OUT. The receiving circuit 220 may amplify the input signal IN in synchronization with the receiving clock signal PE. The receiving circuit 220 may generate the output signal OUT by sampling the signal amplified in synchronization with the receiving clock signal PE, in synchronization with the sampling clock signal PS. Timing at which the receiving circuit 220 receives the input signal IN and timing at which the received signal is sampled may be different from each other. The receiving circuit 220 may receive the input signal IN by amplifying the input signal IN. The receiving circuit 220 may amplify the input signal IN by additionally receiving the complementary signal INB of the input signal IN. Alternatively, the receiving circuit 220 may amplify the input signal IN by additionally receiving a reference voltage VREF. The reference voltage VREF may have a voltage level corresponding to, for example, the middle of the swing width of the input signal IN. The input signal IN may be input data, and the output signal OUT may be output data and be the internal data of the semiconductor apparatus 200. The receiving circuit 220 may be a data receiving circuit which receives the input data.

In the embodiment, the receiving clock signal PE may have a first pulse width, and the first pulse width may be a pulse width corresponding to the valid window or valid eye of the input signal IN. The valid window or valid eye may mean a period or duration in which the input signal IN may have an accurate defined level without being influenced by noise or a glitch. The sampling clock signal PS may have a second pulse width, and the second pulse width may be wider than the first pulse width. The second pulse width may correspond to the pulse width of the external clock signal CLKE or be wider than the pulse width of the external clock signal CLKE. The second pulse width may correspond to the pulse width of the reference clock signal CLKR. The receiving circuit 220 may amplify the input signal IN only in the period of the valid window and/or valid eye of the input signal IN in synchronization with the receiving clock signal PE, and thereby, may accurately receive the input signal IN. Also, the receiving circuit 220 may sample the amplified signal in synchronization with the sampling clock signal PS, and thereby, may sufficiently secure a setup and/or maintain the margin for generating the output signal OUT from the input signal IN. Therefore, the receiving circuit 220 may generate the output signal OUT accurately corresponding to the level of the input signal IN regardless of a factor of surrounding environment such as a crosstalk.

Figure 3:
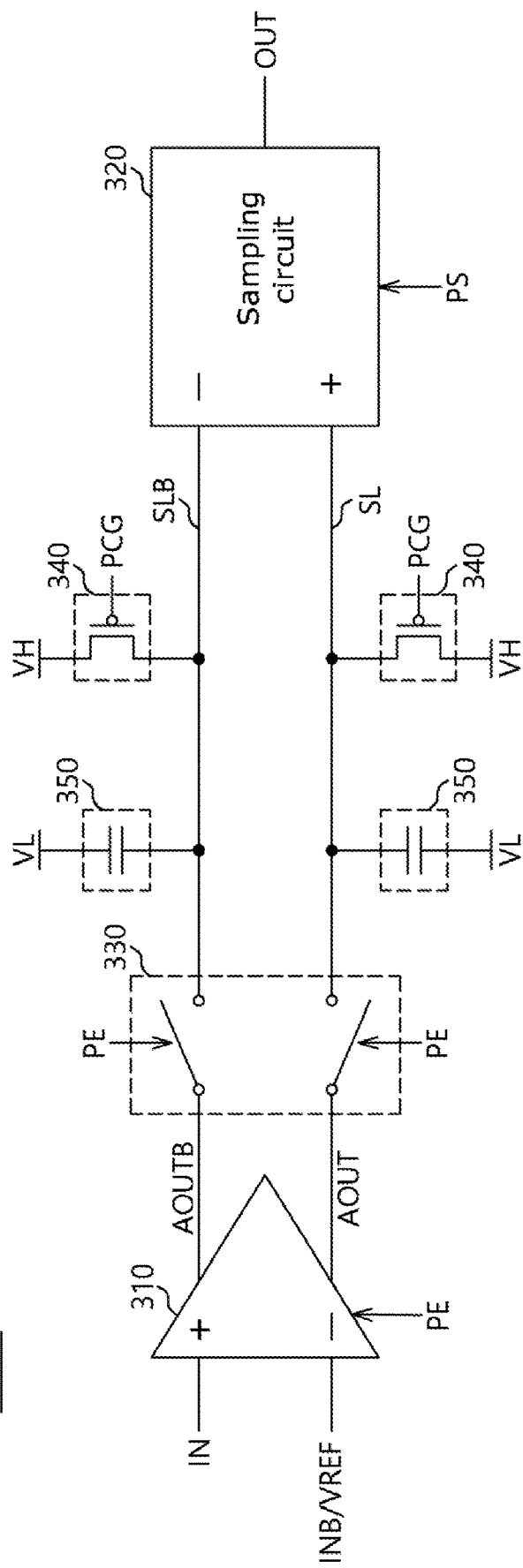
FIG. 3 is a diagram illustrating a configuration of the receiving circuit shown in FIG. 2.

FIG. 3 is a diagram illustrating a configuration of the receiving circuit 220 shown in FIG. 2. In FIG. 3, the receiving circuit 220 may include a receiver 310 and a sampling circuit 320. The receiver 310 may receive the input signal IN and one of the complementary signal INB of the input signal IN and the reference voltage VREF. The receiver 310 may generate amplified signals AOUT and AOUTB by comparing and amplifying the input signal IN and one of the complementary signal INB and the reference voltage VREF. The receiver 310 may be a differential amplifier, and may generate a pair of amplified signals. The receiver 310 may receive the receiving clock signal PE. The receiving circuit 310 may generate the amplified signals AOUT and AOUTB by amplifying the input signal IN in synchronization with the receiving clock signal PE. The receiver 310 may generate the amplified signals AOUT and AOUTB from the input signal IN in the enable period of the receiving clock signal PE. The receiver 310 might not perform an amplifying operation in the disable period of the receiving clock signal PE. The receiver 310 may generate the amplified signals AOUT and AOUTB, and may output the amplified signals AOUT and AOUTB to signal lines SL and SLB. The signal lines SL and SLB may be a pair of lines. For example, the receiver 310 may output the amplified signal AOUT to the signal line SL and output the amplified signal AOUTB to the signal line SLB.

The sampling circuit 320 may be coupled with the signal lines SL and SLB, sample the voltage levels of the signal lines SL and SLB and generate the output signal OUT. The sampling circuit 320 may receive the sampling clock signal PS. The sampling circuit 320 may generate the output signal OUT by sampling the amplified signals AOUT and AOUTB in synchronization with the sampling clock signal PS. The sampling circuit 320 may generate the output signal OUT by sampling the voltage levels of the signal lines SL and SLB in synchronization with the sampling clock signal PS. The sampling circuit 320 may generate the output signal OUT by sampling the voltage levels of the signal lines SL and SLB in the enable period of the sampling clock signal PS.

In FIG. 3, the receiving circuit 220 may further include a synchronization switch 330, a precharge circuit 340 and a capacitor 350. The synchronization switch 330 may receive the receiving clock signal PE, and may couple the receiver 310 and the signal lines SL and SLB in synchronization with the receiving clock signal PE. The synchronization switch 330 may transmit the amplified signals AOUT and AOUTB to the signal lines SL and SLB in synchronization with the receiving clock signal PE, and may output the amplified signals AOUT and AOUTB to the signal lines SL and SLB in the enable period of the receiving clock signal PE. The precharge circuit 340 may be coupled with the signal lines SL and SLB. The precharge circuit 340 may precharge the signal lines SL and SLB by receiving a precharge signal PCG. The precharge circuit 340 may initialize the signal lines SL and SLB and the levels of the amplified signals AOUT and AOUTB on the signal lines SL and SLB when the precharge signal PCG is enabled. The precharge signal PCG may have a phase later than the sampling clock signal PS. The precharge signal PCG may be enabled after the sampling operation of the sampling circuit 320 is completed. The precharge circuit 340 may receive, for example, a high voltage VH, and may precharge the voltage levels of the signal lines SL and SLB with the high voltage VH based on the precharge signal PCG. The capacitor 350 may be coupled with the signal lines SL and SLB. The capacitor 350 may be coupled, for example, between the terminal of a low voltage VL and the signal lines SL and SLB. The low voltage VL may have a level lower than the high voltage VH. In an embodiment, the high voltage VH and the low voltage VL may have voltage levels corresponding to the power supply voltages of the receiver 310 or the sampling circuit 320. The capacitor 350 may stably maintain the voltage levels of the signal lines SL and SLB when the amplified signals AOUT and AOUTB are transmitted to the signal lines SL and SLB by the synchronization switch 330.

Figure 4:
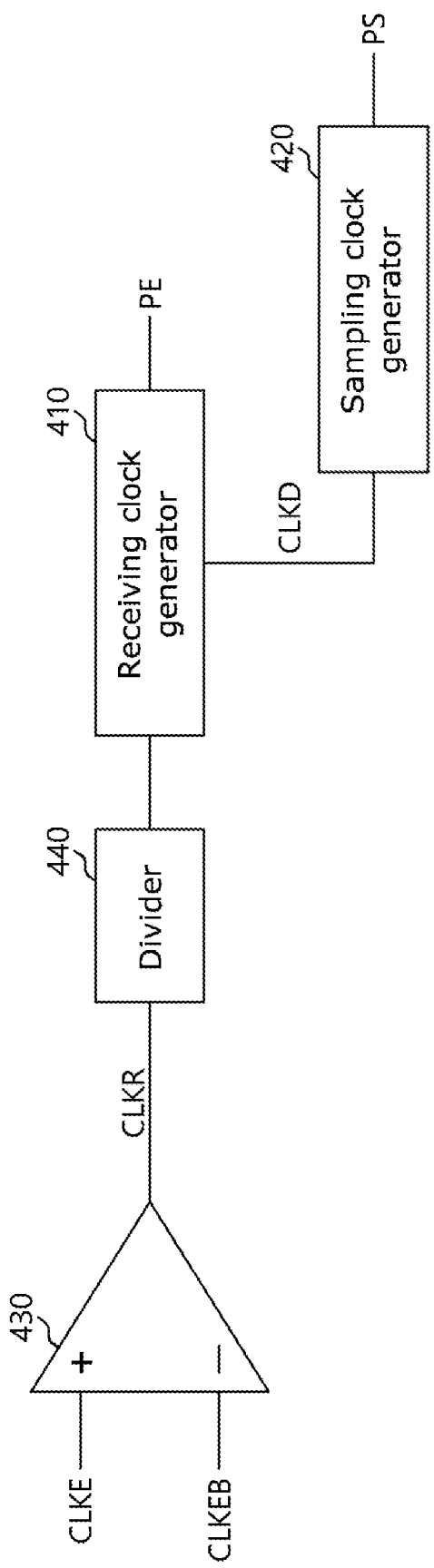
FIG. 4 is a diagram illustrating a configuration of the internal clock generation circuit shown in FIG. 2.

FIG. 4 is a diagram illustrating a configuration of the internal clock generation circuit 210 shown in FIG. 2. In FIG. 4, the internal clock generation circuit 210 may include a receiving clock generator 410, a sampling clock generator 420 and a clock buffer 430. The clock buffer 430 may generate the reference clock signal CLKR by receiving the external clock signal CLKE. The external clock signal CLKE may be received as differential signals, and the clock buffer 430 may generate the reference clock signal CLKR by differentially amplifying the external clock signal CLKE and a complementary signal CLKEB. The receiving clock generator 410 may generate a delayed clock signal CLKD and the receiving clock signal PE based on the reference clock signal CLKR. The receiving clock generator 410 may generate the delayed clock signal CLKD by delaying the reference clock signal CLKR by a first time, and may generate the receiving clock signal PE by delaying the delayed clock signal CLKD by a second time. The sampling clock generator 420 may receive the delayed clock signal CLKD. The sampling clock generator 420 may generate the sampling clock signal PS by delaying the delayed clock signal CLKD by the second time and a third time. The first to third times will be described later.

In FIG. 4, the internal clock generation circuit 210 may further include a divider 440. The divider 440 may generate a divided reference clock signal by frequency-dividing the reference clock signal CLKR outputted from the clock buffer 430. For example, the divider 440 may generate the divided reference clock signal by dividing by 2 or 4 the reference clock signal CLKR. When the divider 440 is used, the divided reference clock signal may have a lower frequency and a longer cycle than the external clock signal CLKE.

Figure 5:
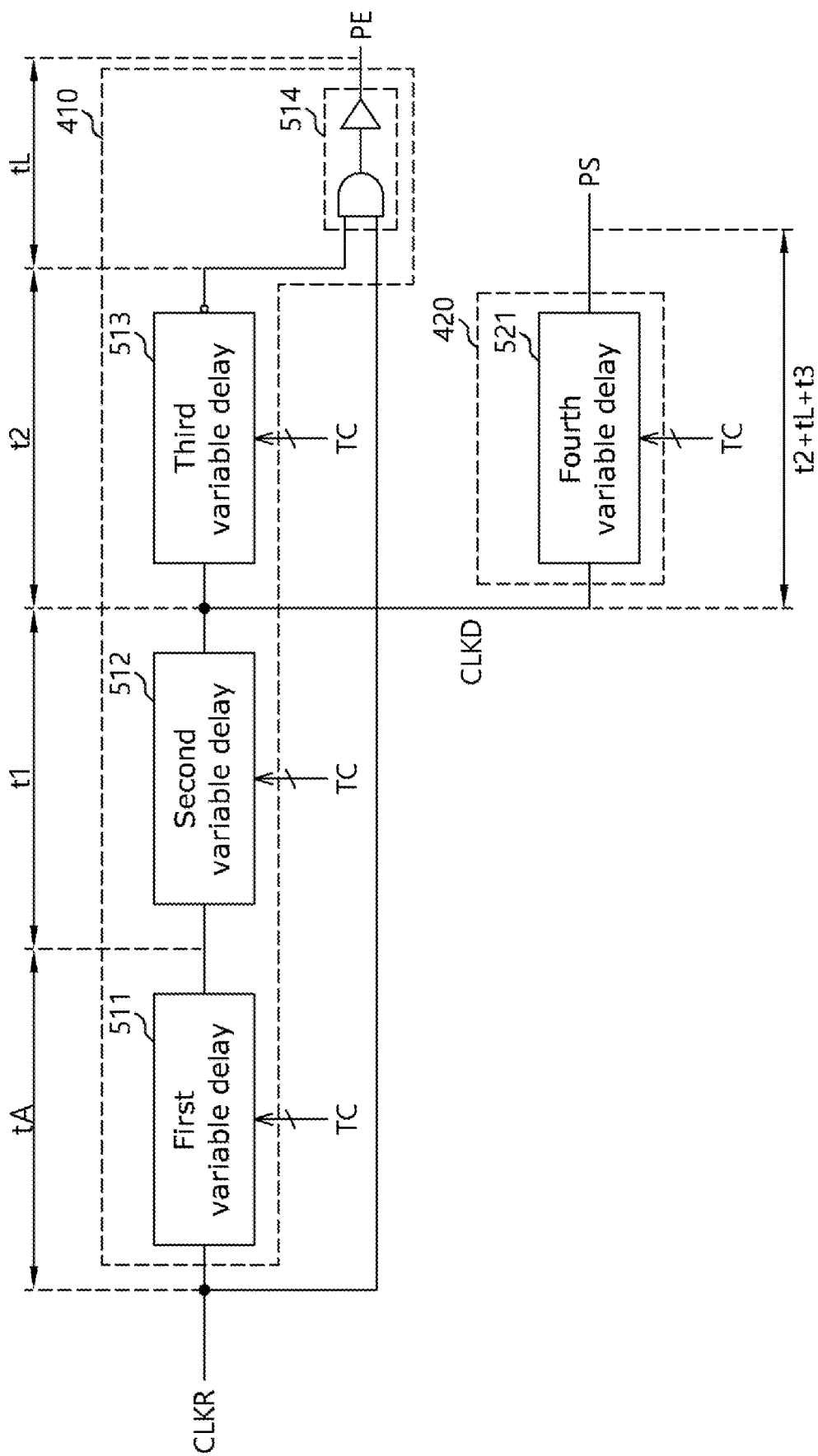
FIG. 5 is a diagram illustrating a configurations of the receiving clock generator and the sampling clock generator shown in FIG. 4.

FIG. 5 is a diagram illustrating a configuration of the receiving clock generator 410 and the sampling clock generator 420 shown in FIG. 4. The receiving clock generator 410 may include a first variable delay 511, a second variable delay 212, a third variable delay 513 and a logic gate 514. The first variable delay 511 may receive the reference clock signal CLKR and delay the reference clock signal CLKR by a predetermined time tA. The predetermined time tA may be changed based on different embodiments and different circumstances.

The word "predetermined" as used herein with respect to a parameter, such as a preset time, means that a value for the parameter is determined prior to the parameter being used in a process or algorithm. For some embodiments, the value for the parameter is determined before the process or algorithm begins. In other embodiments, the value for the parameter is determined during the process or algorithm but before the parameter is used in the process or algorithm.

The first variable delay 511 may receive, for example, a training code TC, and may have a variable delay amount based on the training code TC. The training code TC may be generated based on a training operation performed between the external apparatus 110 shown in FIG. 1 and the semiconductor apparatus 200 shown in FIG. 2. The first variable delay 511 may cause the enable time of the receiving clock signal PE to be synchronized with the start time of the valid window and/or valid eye of the input signal IN. The second variable delay 512 may receive the output of the first variable delay 511 and output the delayed clock signal CLKD. The second variable delay 512 may generate the delayed clock signal CLKD by delaying the output of the first variable delay 511 by a first time t1. The first time may be defined as a time from the start time of the valid window and/or valid eye of the input signal IN to the center of the input signal IN. The center of the input signal IN may be a point of time that is synchronized with the external clock signal CLKE and/or the reference clock signal CLKR. The delay amount of the second variable delay 512 and the first time t1 may be changed based on the training code TC. The third variable delay 513 may receive the delayed clock signal CLKD. The third variable delay 513 may delay the delayed clock signal CLKD by a second time t2. The third variable delay 513 may invert a signal generated by delaying the delayed clock signal CLKD by the second time t2, and output the inverted signal. The second time t2 may be defined as a time from the center of the input signal IN to the end time of the valid window and/or valid eye of the input signal IN. The delay amount of the third variable delay 513 and the second time t2 may be changed based on the training code TC. The logic gate 514 may receive the output of the third variable delay 513 and the reference clock signal CLKR and generate the receiving clock signal PE. The logic gate 514 may be configured to perform an AND operation. For example, the logic gate 514 may include an AND gate. A delay time by the logic gate 514 may be tL. When assuming that the delay time tL by the logic gate 514 is a substantially small value, the sum of the first time t1 and the second time t2 may be a time corresponding to the duration of the valid window and/or valid eye of the input signal IN, and the receiving clock signal PE may have a pulse width corresponding to the sum of the first time t1 and the second time t2. The sampling clock generator 420 may include a fourth variable delay 521. The fourth variable delay 521 may receive the delayed clock signal CLKD and generate the sampling clock signal PS. The delay amount of the fourth variable delay 521 may be changed based on the training code TC. The delay amount of the fourth variable delay 521 may be the sum of the second time t2, the delay time tL by the logic gate 514 and a third time t3. The third time t3 may define a point of time at which the sampling clock signal PS is enabled after the receiving clock signal PE is disabled. While examples of the receiving clock generator 410 and the sampling clock generator 420 are shown in FIG. 5, it is to be noted that the embodiment is not limited thereto. Clock generators for generating the receiving clock signal PE and the sampling clock signal PS may be designed in a variety of ways.

Figure 6:
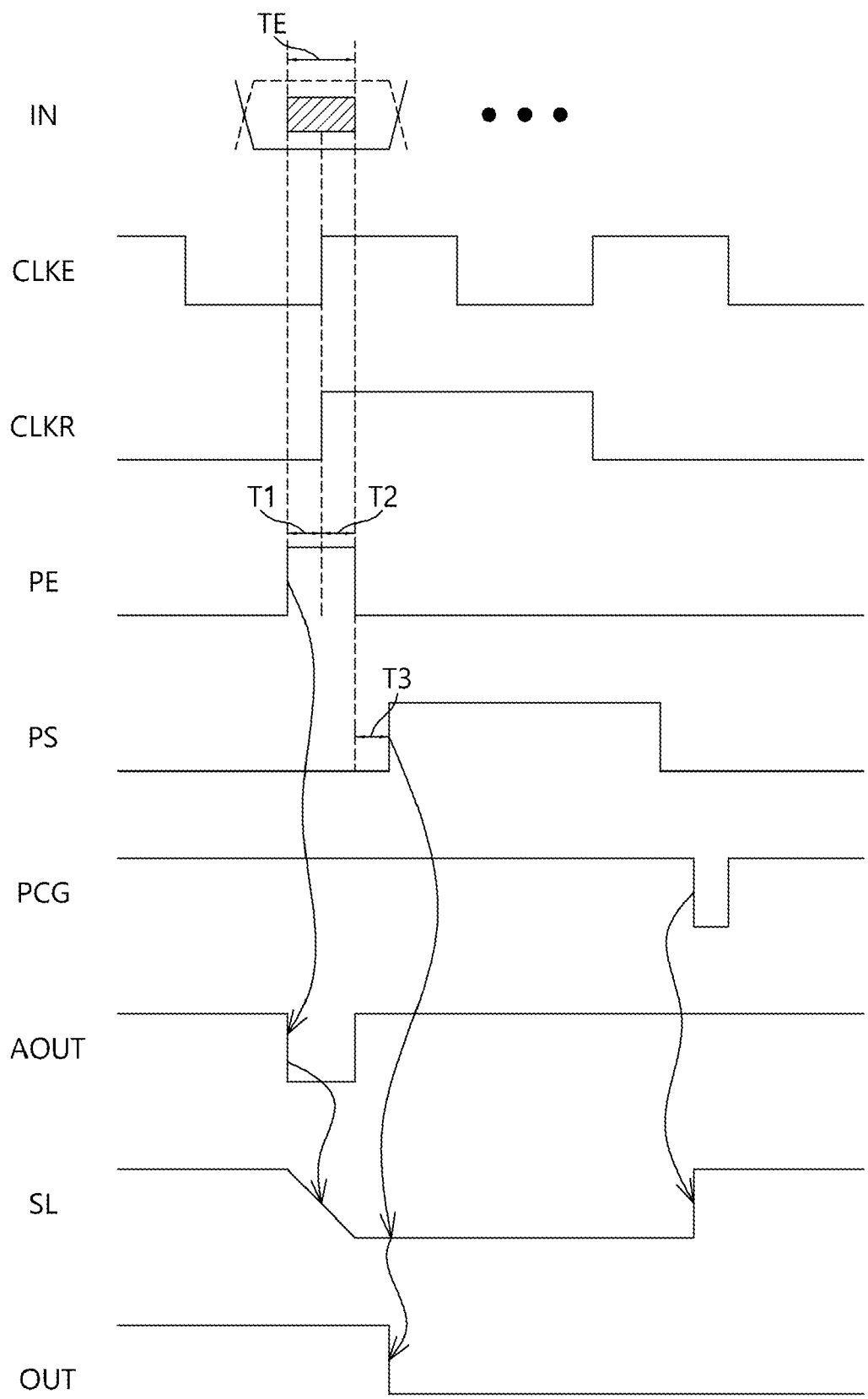
FIG. 6 is a timing diagram to assist in the explanation of the operation of the semiconductor apparatus in accordance with the embodiment.

FIG. 6 is a timing diagram to assist in the explanation of the operation of the semiconductor apparatus 200 in accordance with the embodiment. The operation of the semiconductor apparatus 200 in accordance with the embodiment will be described below with reference to FIGS. 2 to 6. The external clock signal CLKE may be received by being center-aligned with the window and/or eye of the input signal IN. In an embodiment, the external clock signal CLKE may be received by being edge-aligned with the window and/or eye of the input signal IN. It is assumed that the input signal IN is a signal which has a low level. Since the reference clock signal CLKR may be generated by dividing by 2 the external clock signal CLKE, the reference clock signal CLKR may be center-aligned with the input signal IN similarly to the external clock signal CLKE.

The internal clock generation circuit 210 may generate the receiving clock signal PE having a pulse which is enabled for a time TE corresponding to the valid window and/or valid eye of the input signal IN. The receiving clock signal PE may have a rising edge which is generated a first time t1 earlier than the rising edge of the reference clock signal CLKR, and may have a falling edge which is generated a second time t2 later than the rising edge of the reference clock signal CLKR. For this example, the delay time tL by the logic gate 514 will not be considered. The receiver 310 may generate the amplified signal AOUT which has a low level, by amplifying the input signal IN for the time TE corresponding to the valid window of the input signal IN in synchronization with the receiving clock signal PE. Therefore, the receiver 310 may generate the amplified signal AOUT by accurately amplifying the valid level of the input signal IN. The synchronization switch 330 may transmit the amplified signal AOUT to the signal lines SL and SLB in synchronization with the receiving clock signal PE. Thus, the voltage level of the signal line SL may be lowered to a low level, and the lowered low level may be held. If the receiving clock signal PE is disabled, the receiver 310 may interrupt the amplifying operation and the synchronization switch 330 may be turned off. The signal line SL may be held at a voltage level corresponding to the amplified signal AOUT.

If the third time t3 elapses after the receiving clock signal PE is disabled, the sampling clock signal PS may be enabled. The sampling circuit 320 may generate the output signal OUT by sampling the voltage level of the signal line SL in synchronization with the sampling clock signal PS. Hence, the output signal OUT may transition to have a low level at a point of time when the sampling clock signal PS is enabled. If the sampling clock signal PS is disabled, the precharge signal PCG may be enabled. If the precharge signal PCG is enabled, the precharge circuit 340 may precharge the signal line SL to the level of the high voltage VH.

Figure 7:
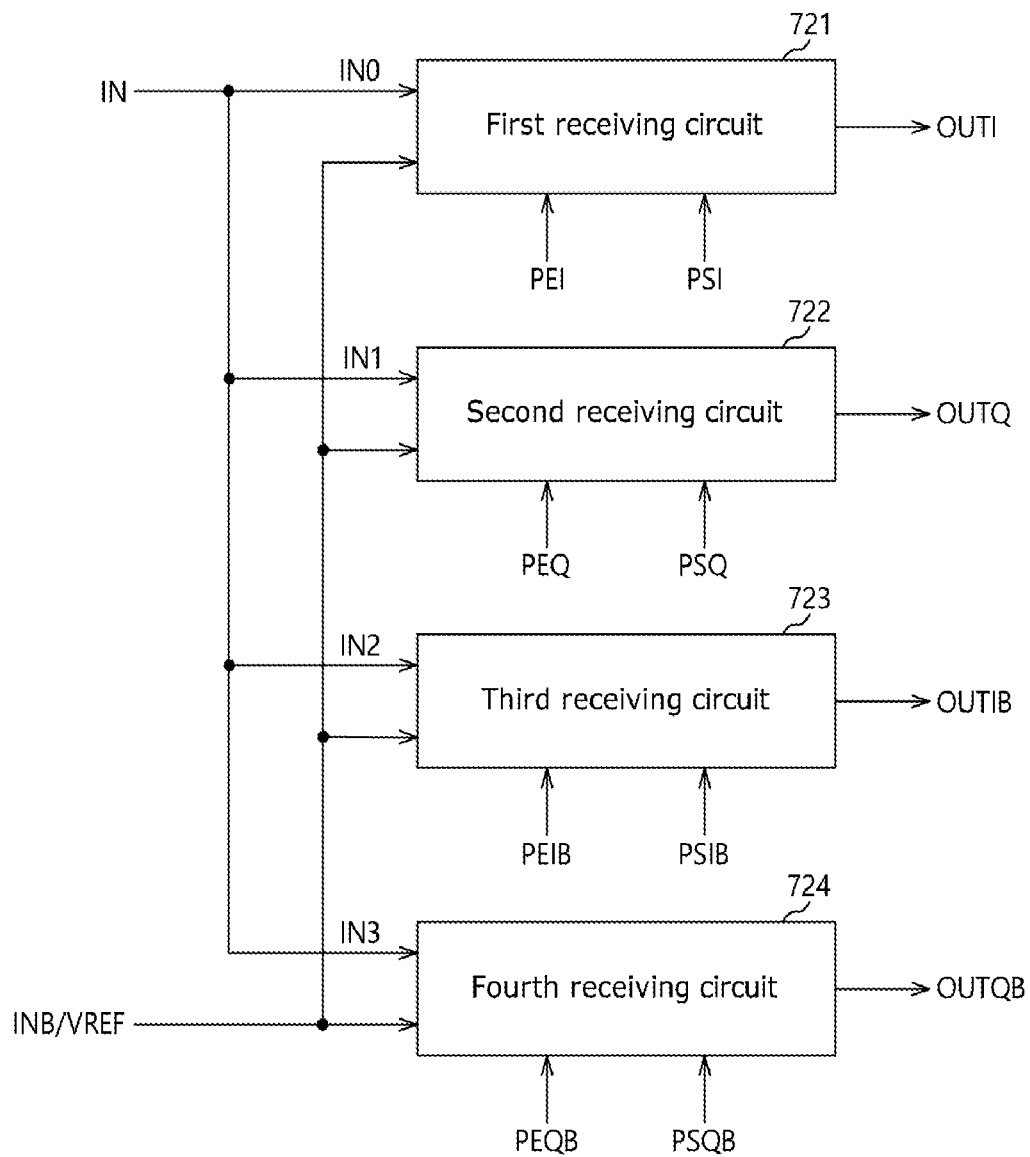
FIG. 7 is a diagram illustrating a configuration of a semiconductor apparatus in accordance with an embodiment.

FIG. 7 is a diagram illustrating a configuration of a semiconductor apparatus 700 in accordance with an embodiment. In FIG. 7, the semiconductor apparatus 700 may include an internal clock generation circuit 710 and a plurality of receiving circuits. The plurality of receiving circuits may include a first receiving circuit 721, a second receiving circuit 722, a third receiving circuit 723 and a fourth receiving circuit 724. The internal clock generation circuit 710 may receive an external clock signal CLKE. The internal clock generation circuit 710 may generate a reference clock signal from the external clock signal CLKE. The reference clock signal may include a plurality of phase clock signals. The plurality of phase clock signals may include a first phase clock signal ICLK, a second phase clock signal QCLK, a third phase clock signal IBCLK and a fourth phase clock signal QBCLK. The second phase clock signal QCLK may have a phase 90 degrees later than the first phase clock signal ICLK, the third phase clock signal IBCLK may have a phase 90 degrees later than the second phase clock signal QCLK, and the fourth phase clock signal QBCLK may have a phase 90 degrees later than the third phase clock signal IBCLK. The internal clock generation circuit 710 may generate a first receiving clock signal PEI, a second receiving clock signal PEQ, a third receiving clock signal PEIB and a fourth receiving clock signal PEQB based on the first to fourth phase clock signals ICLK, QCLK, IBCLK and QBCLK. Further, the internal clock generation circuit 710 may generate a first sampling clock signal PSI, a second sampling clock signal PSQ, a third sampling clock signal PSIB and a fourth sampling clock signal PSQB based on the first to fourth phase clock signals ICLK, QCLK, IBCLK and QBCLK. The first to fourth phase clock signals ICLK, QCLK, IBCLK and QBCLK may be synchronized with first to fourth input signals IN, respectively, which are sequentially received. For example, the first phase clock signal ICLK may be center-aligned with the first input signal IN0, and the first receiving clock signal PEI may have a pulse width corresponding to the valid window and/or valid eye of the first input signal IN0. The second phase clock signal QCLK may be center-aligned with the second input signal IN1, and the second receiving clock signal PEQ may have a pulse width corresponding to the valid window and/or valid eye of the second input signal IN1. The pulse of the second receiving clock signal PEQ may be generated later by a phase corresponding to 90 degrees of the reference clock signal when compared to the pulse of the first receiving clock signal PEI. That is to say, the phase difference of the first and second receiving clock signals PEI and PEQ may be the same as the phase difference of the first and second phase clock signals ICLK and QCLK. The third phase clock signal IBCLK may be center-aligned with the third input signal IN2, and the third receiving clock signal PEIB may have a pulse width corresponding to the valid window and/or valid eye of the third input signal IN2. The pulse of the third receiving clock signal PEIB may be generated later by a phase corresponding to 90 degrees of the reference clock signal when compared to the pulse of the second receiving clock signal PEQ. That is to say, the phase difference of the second and third receiving clock signals PEQ and PEIB may be the same as the phase difference of the second and third phase clock signals QCLK and IBCLK. The fourth phase clock signal QBCLK may be center-aligned with the fourth input signal IN3, and the fourth receiving clock signal PEQB may have a pulse width corresponding to the valid window and/or valid eye of the fourth input signal IN3. The pulse of the fourth receiving clock signal PEQB may be generated later by a phase corresponding to 90 degrees of the reference clock signal when compared to the pulse of the third receiving clock signal PEIB. That is to say, the phase difference of the third and fourth receiving clock signals PEIB and PEQB may be the same as the phase difference of the third and fourth phase clock signals IBCLK and QBCLK.

The first to fourth receiving circuits 721, 722, 723 and 724 may receive the input signal IN, respectively, and one of the complementary signal INB of the input signal IN and a reference voltage VREF. The first receiving circuit 721 may receive the first receiving clock signal PEI and the first sampling clock signal PSI, and may amplify the input signal IN in synchronization with the first receiving clock signal PEI. The first receiving circuit 721 may generate a first output signal OUTI by sampling the amplified signal in synchronization with the first sampling clock signal PSI. The second receiving circuit 722 may receive the second receiving clock signal PEQ and the second sampling clock signal PSQ, and may amplify the input signal IN in synchronization with the second receiving clock signal PEQ. The second receiving circuit 722 may generate a second output signal OUTQ by sampling the amplified signal in synchronization with the second sampling clock signal PSQ. The third receiving circuit 723 may receive the third receiving clock signal PEIB and the third sampling clock signal PSIB, and may amplify the input signal IN in synchronization with the third receiving clock signal PEIB. The third receiving circuit 723 may generate a third output signal OUTIB by sampling the amplified signal in synchronization with the third sampling clock signal PSIB. The fourth receiving circuit 724 may receive the fourth receiving clock signal PEQB and the fourth sampling clock signal PSQB, and may amplify the input signal IN in synchronization with the fourth receiving clock signal PEQB. The fourth receiving circuit 724 may generate a fourth output signal OUTQB by sampling the amplified signal in synchronization with the fourth sampling clock signal PSQB. The receiving circuit 220 shown in FIG. 3 may be applied as each of the first to fourth receiving circuits 721, 722, 723 and 724.

Figure 8:
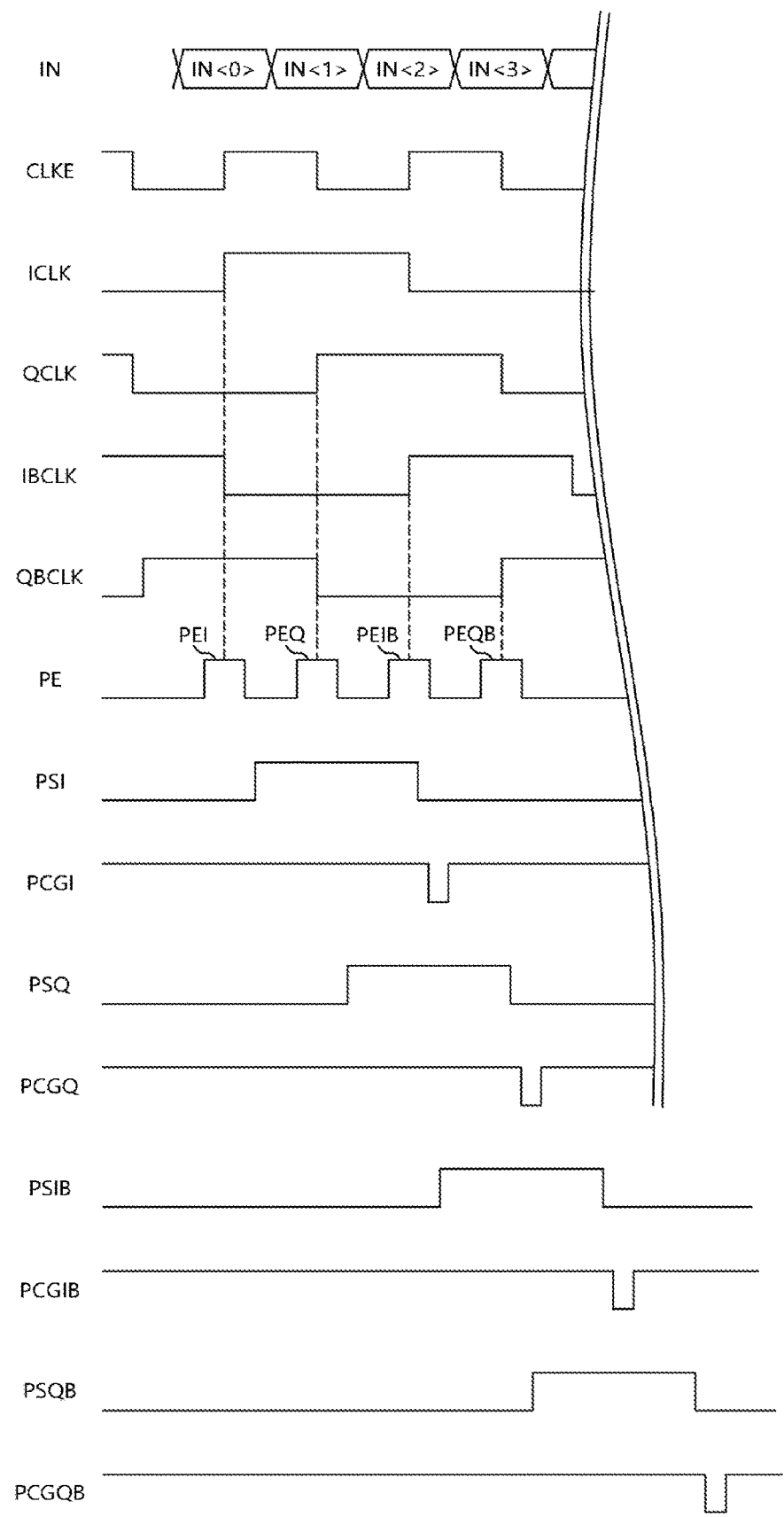
FIG. 8 is a timing diagram to assist in the explanation of the operation of the semiconductor apparatus in accordance with the embodiment.

FIG. 8 is a diagram to assist in the explanation of the operation of the semiconductor apparatus 700 in accordance with the embodiment. The operation of the semiconductor apparatus 700 in accordance with the embodiment will be described below with reference to FIGS. 7 and 8. The input signal IN may be inputted as a continuous stream, and it is illustrated as an example that first to fourth input signals IN<0>, IN<1>, IN<2> and IN<3> are inputted. The rising edges and falling edges of the external clock signal CLKE may be center-aligned with the first to fourth input signals IN<0>, IN<1>, IN<2> and IN<3>, respectively. The internal clock generation circuit 710 may generate the first phase clock signal ICLK, the second phase clock signal QCLK, the third phase clock signal IBCLK and the fourth phase clock signal QBCLK which sequentially have a phase difference of 90 degrees, by dividing the external clock signal CLKE. The internal clock generation circuit 710 may generate the first to fourth receiving clock signals PEI, PEQ, PEIB and PEQB and the first to fourth sampling clock signals PSI, PSQ, PSIB and PSQB, based on the first to fourth phase clock signals ICLK, QCLK, IBCLK and QBCLK. For example, the internal clock generation circuit 710 may generate the first receiving clock signal PEI and the first sampling clock signal PSI by delaying the fourth phase clock signal QBCLK, may generate the second receiving clock signal PEQ and the second sampling clock signal PSQ by delaying the first phase clock signal ICLK, may generate the third receiving clock signal PEIB and the third sampling clock signal PSIB by delaying the second phase clock signal QCLK, and may generate the fourth receiving clock signal PEQB and the fourth sampling clock signal PSQB by delaying the third phase clock signal IBCLK. In an embodiment, the semiconductor apparatus 700 may delay the input signal IN. The internal clock generation circuit 710 may generate the first receiving clock signal PEI and the first sampling clock signal PSI by delaying the first phase clock signal ICLK, may generate the second receiving clock signal PEQ and the second sampling clock signal PSQ by delaying the second phase clock signal QCLK, may generate the third receiving clock signal PEIB and the third sampling clock signal PSIB by delaying the third phase clock signal IBCLK, and may generate the fourth receiving clock signal PEQB and the fourth sampling clock signal PSQB by delaying the fourth phase clock signal QBCLK. The semiconductor apparatus 700 may delay the input signal IN by a phase corresponding to 90 degrees of the phase clock signals such that delayed input signals may be synchronized with the first to fourth receiving clock signals PEI, PEQ, PEIB and PEQB, respectively, generated by delaying the first to fourth phase clock signals ICLK, QCLK, IBCLK and QBCLK.

The first receiving clock signal PEI may have a pulse width corresponding to the valid window and/or valid eye of the first input signal IN<0>, the second receiving clock signal PEQ may have a pulse width corresponding to the valid window and/or valid eye of the second input signal IN<1>, the third receiving clock signal PEIB may have a pulse width corresponding to the valid window and/or valid eye of the third input signal IN<2>, and the fourth receiving clock signal PEQB may have a pulse width corresponding to the valid window and/or valid eye of the fourth input signal IN<3>. The pulse widths of the first to fourth receiving clock signals PEI, PEQ, PEIB and PEQB may be all the same. The first receiving circuit 721 may amplify the level of the first input signal IN<0> in synchronization with the first receiving clock signal PEI, the second receiving circuit 722 may amplify the level of the second input signal IN<1> in synchronization with the second receiving clock signal PEQ, the third receiving circuit 723 may amplify the level of the third input signal IN<2> in synchronization with the third receiving clock signal PEIB, and the fourth receiving circuit 724 may amplify the level of the fourth input signal IN<3> in synchronization with the fourth receiving clock signal PEQB.

The first to fourth sampling clock signals PSI, PSQ, PSIB and PSQB may be generated after the first to fourth receiving clock signals PEI, PEQ, PEIB and PEQB are disabled, respectively. The first receiving circuit 721 may generate the first output signal OUTI by sampling the signal amplified in synchronization with the first receiving clock signal PEI, in synchronization with the first sampling clock signal PSI. If the first sampling clock signal PSI is disabled, a precharge signal PCGI may be enabled, and the signal line of the first receiving circuit 721 may be precharged. The second receiving circuit 722 may generate the second output signal OUTQ by sampling the signal amplified in synchronization with the second receiving clock signal PEQ, in synchronization with the second sampling clock signal PSQ. If the second sampling clock signal PSQ is disabled, a precharge signal PCGQ may be enabled, and the signal line of the second receiving circuit 722 may be precharged. The third receiving circuit 723 may generate the third output signal OUTIB by sampling the signal amplified in synchronization with the third receiving clock signal PEIB, in synchronization with the third sampling clock signal PSIB. If the third sampling clock signal PSIB is disabled, a precharge signal PCGIB may be enabled, and the signal line of the third receiving circuit 723 may be precharged. The fourth receiving circuit 724 may generate the fourth output signal OUTQB by sampling the signal amplified in synchronization with the fourth receiving clock signal PEQB, in synchronization with the fourth sampling clock signal PSQB. If the fourth sampling clock signal PSQB is disabled, a precharge signal PCGQB may be enabled, and the signal line of the fourth receiving circuit 724 may be precharged.

Figure 9:
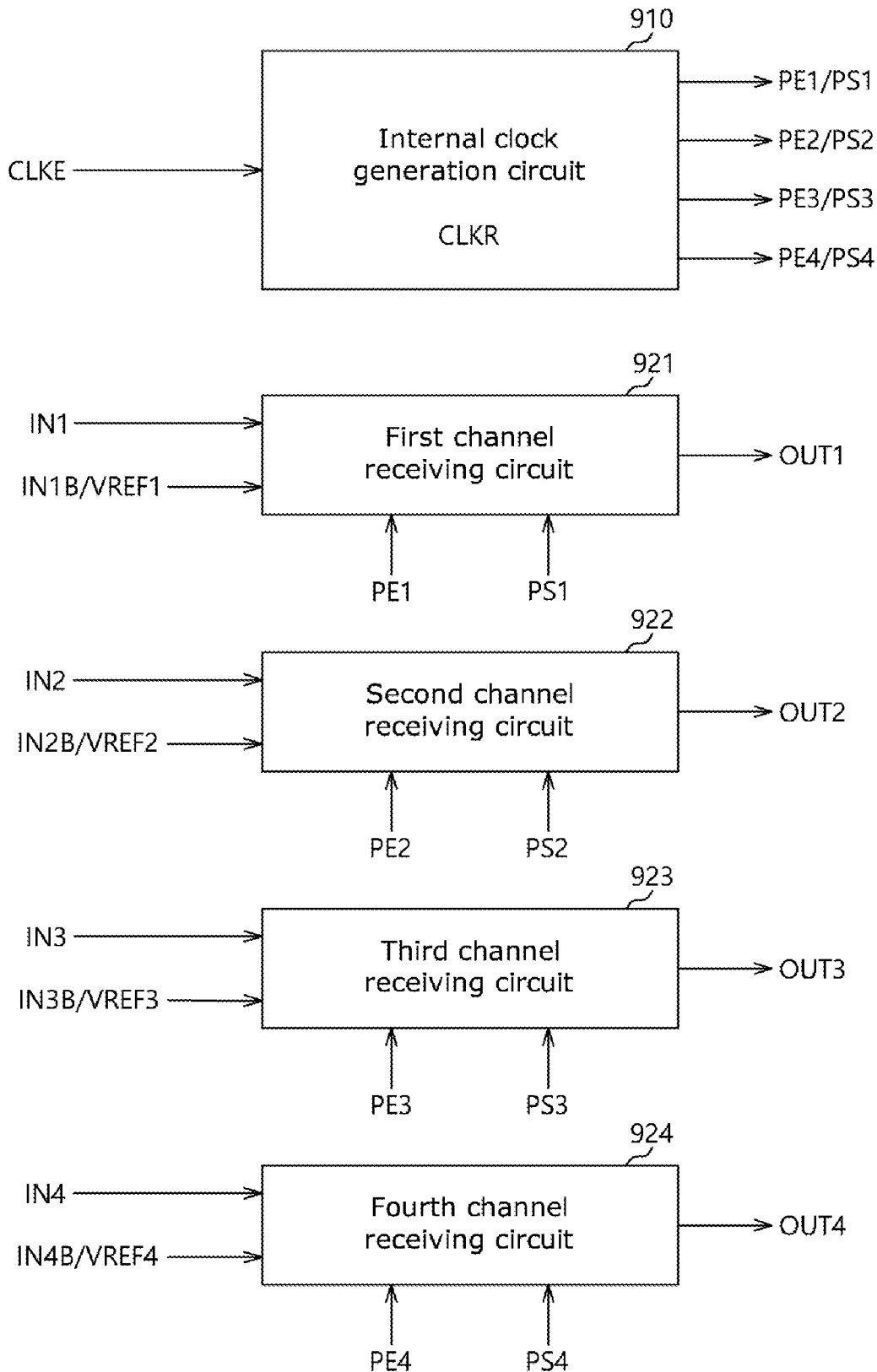
FIG. 9 is a diagram illustrating a configuration of a semiconductor apparatus in accordance with an embodiment.

FIG. 9 is a diagram illustrating a configuration of a semiconductor apparatus 900 in accordance with an embodiment. In FIG. 9, the semiconductor apparatus 900 may include an internal clock generation circuit 910 and a plurality of channel receiving circuits. The plurality of channel receiving circuits may include a first channel receiving circuit 921, a second channel receiving circuit 922, a third channel receiving circuit 923 and a fourth channel receiving circuit 924. The first channel receiving circuit 921 may be coupled with a first channel and/or a first signal bus and receive a first input signal IN1. The first channel receiving circuit 921 may receive the complementary signal IN1B of the first input signal IN1 or a first reference voltage VREF1. The second channel receiving circuit 922 may be coupled with a second channel and/or a second signal bus and receive a second input signal IN2. The second channel receiving circuit 922 may receive the complementary signal IN2B of the second input signal IN2 or a second reference voltage VREF2. The third channel receiving circuit 923 may be coupled with a third channel and/or a third signal bus and receive a third input signal IN3. The third channel receiving circuit 923 may receive the complementary signal IN3B of the third input signal IN3 or a third reference voltage VREF3. The fourth channel receiving circuit 924 may be coupled with a fourth channel and/or a fourth signal bus and receive a fourth input signal IN4. The fourth channel receiving circuit 924 may receive the complementary signal IN4B of the fourth input signal IN4 or a fourth reference voltage VREF4. The first to fourth signal buses may be different channels, and may have different channel characteristics and skews. The semiconductor apparatus 900 may perform a training operation for the first to fourth channels, with the external apparatus 110 shown in FIG. 1, and may set the levels of the first to fourth reference voltages VREF1, VREF2, VREF3 and VREF4 to be the same or to be different from one another, depending on the characteristics of the first to fourth channels.

The internal clock generation circuit 910 may receive an external clock signal CLKE and generate a reference clock signal CLKR. The internal clock generation circuit 910 may generate first to fourth channel receiving clock signals PE1, PE2, PE3 and PE4 and first to fourth sampling clock signals PS1, PS2, PS3 and PS4 based on the reference clock signal CLKR. The first channel receiving clock signal PE1 may have a pulse width corresponding to the valid window and/or valid eye of the first input signal IN1. The second channel receiving clock signal PE2 may have a pulse width corresponding to the valid window and/or valid eye of the second input signal IN2. The third channel receiving clock signal PE3 may have a pulse width corresponding to the valid window and/or valid eye of the third input signal IN3. The fourth channel receiving clock signal PE4 may have a pulse width corresponding to the valid window and/or valid eye of the fourth input signal IN4. The pulse widths of the first to fourth channel receiving clock signals PE1, PE2, PE3 and PE4 may be the same with or different from one another depending on the characteristics of the first to fourth channels. That is to say, the first fourth channel receiving clock signals PE1, PE2, PE3 and PE4 may be enabled at different points of time and be disabled at different points of time, depending on the characteristics of the first to fourth channels. Also, the first to fourth sampling clock signals PS1, PS2, PS3 and PS4 may be enabled at different points of time depending on the characteristics of the first to fourth channels.

The first channel receiving circuit 921 may amplify the first input signal IN1 in synchronization with the first channel receiving clock signal PE1. The first channel receiving circuit 921 may generate a first output signal OUT1 by sampling the signal amplified in synchronization with the first channel receiving clock signal PE1, in synchronization with the first sampling clock signal PS1. The second channel receiving circuit 922 may amplify the second input signal IN2 in synchronization with the second channel receiving clock signal PE2. The second channel receiving circuit 922 may generate a second output signal OUT2 by sampling the signal amplified in synchronization with the second channel receiving clock signal PE2, in synchronization with the second sampling clock signal PS2. The third channel receiving circuit 923 may amplify the third input signal IN3 in synchronization with the third channel receiving clock signal PE3. The third channel receiving circuit 923 may generate a third output signal OUT3 by sampling the signal amplified in synchronization with the third channel receiving clock signal PE3, in synchronization with the third sampling clock signal PS3. The fourth channel receiving circuit 924 may amplify the fourth input signal IN4 in synchronization with the fourth channel receiving clock signal PE4. The fourth channel receiving circuit 924 may generate a fourth output signal OUT4 by sampling the signal amplified in synchronization with the fourth channel receiving clock signal PE4, in synchronization with the fourth sampling clock signal PS4.

While various embodiments have been described above, it will be understood to those skilled in the art that the embodiments described are examples only. Accordingly, the receiving circuit, the semiconductor apparatus and the semiconductor system using the same described herein should not be limited based on the described embodiments.

What is claimed is:

1. A receiving circuit comprising:
   an internal clock generation circuit configured to generate a receiving clock signal and a sampling clock signal based on a reference clock signal, the sampling clock signal having a phase different from the receiving clock signal;
   a receiver configured to receive an input signal in synchronization with the receiving clock signal and to generate an amplified signal; and
   a sampling circuit configured to sample the amplified signal in synchronization with the sampling clock signal and to generate an output signal.

2. The receiving circuit according to claim 1, wherein the receiving clock signal has a pulse width corresponding to a valid window of the input signal.

3. The receiving circuit according to claim 1, wherein the sampling clock signal has the same pulse width as the reference clock signal.

4. The receiving circuit according to claim 1, wherein the internal clock generation circuit comprises:
   a receiving clock generator configured to generate a delayed clock signal by delaying the reference clock signal by a predetermined time and a first time, and generate the receiving clock signal by delaying the delayed clock signal by a second time; and
   a sampling clock generator configured to generate the sampling clock signal by delaying the delayed clock signal by the second time and a third time.

5. The receiving circuit according to claim 4, wherein a sum of the first time and the second time corresponds to a duration of the valid window of the input signal.

6. The receiving circuit according to claim 4, further comprising:
   a clock buffer configured to receive an external clock signal; and
   a divider configured to divide an output of the clock buffer and generate the reference clock signal.

7. The receiving circuit according to claim 1, further comprising:
   a synchronization switch configured to output the amplified signal in synchronization with the receiving clock signal.

8. The receiving circuit according to claim 1, further comprising:
   a precharge circuit configured to initialize a level of the amplified signal based on a precharge signal,
   wherein the precharge signal has a phase later than the sampling clock signal.

9. A semiconductor apparatus comprising:
   an internal clock generation circuit configured to generate a receiving clock signal which has a first pulse width and a sampling clock signal which has a second pulse width different from the first pulse width, the sampling clock signal having a phase later than the receiving clock signal, based on a reference clock signal;
   a receiver configured to receive an input signal in synchronization with the receiving clock signal and to generate an amplified signal; and
   a sampling circuit configured to sample the amplified signal in synchronization with the sampling clock signal and to generate an output signal.

10. The semiconductor apparatus according to claim 9, wherein the second pulse width is wider than the first pulse width.

11. The semiconductor apparatus according to claim 9, wherein the first pulse width corresponds to a duration of a valid window of the input signal.

12. The semiconductor apparatus according to claim 9, wherein the internal clock generation circuit comprises:
   a receiving clock generator configured to generate a delayed clock signal by delaying the reference clock signal by a predetermined time and a first time, and generate the receiving clock signal by delaying the delayed clock signal by a second time; and a sampling clock generator configured to generate the sampling clock signal by delaying the delayed clock signal by the second time and a third time.

13. The semiconductor apparatus according to claim 12, wherein a sum of the first time and the second time corresponds to the duration of the valid window of the input signal.

14. The semiconductor apparatus according to claim 12, further comprising:
a clock buffer configured to receive an external clock signal; and
a divider configured to divide an output of the clock buffer and generate the reference clock signal.

15. The semiconductor apparatus according to claim 12, further comprising:
a synchronization switch configured to output the amplified signal in synchronization with the receiving clock signal.

16. The semiconductor apparatus according to claim 12, further comprising:
a precharge circuit configured to initialize a level of the amplified signal based on a precharge signal, wherein the precharge signal has a phase later than the sampling clock signal.

17. A receiving circuit comprising:
a receiver configured to receive input data in synchronization with a receiving clock signal having a pulse width corresponding to a duration of a valid window of the input data and generate an amplified data;
a signal line configured to maintain a level of the amplified data based on the receiving clock signal; and
a sampling circuit configured to amplify a voltage level of the signal line in synchronization with a sampling clock signal and generate output data.

18. The receiving circuit according to claim 17, wherein the sampling clock signal has a pulse width wider than the receiving clock signal, and the sampling clock signal has a phase later than the receiving clock signal.

19. The receiving circuit according to claim 17, further comprising:
a synchronization switch configured to provide the amplified data to the signal line.

20. The receiving circuit according to claim 17, further comprising:
a capacitor configured to be coupled to the signal line and maintain a level of the amplified data.

21. The receiving circuit according to claim 17, further comprising:
a precharge circuit configured to initialize a voltage level of the signal line based on a precharge signal,
wherein the precharge signal has a phase later than the sampling clock signal.

* * * * *